United States Patent [19]
von Recklinghausen

[11] 3,936,720
[45] Feb. 3, 1976

[54] HALF-WAVE RECTIFIER CIRCUIT
[75] Inventor: Daniel R. von Recklinghausen, Arlington, Mass.
[73] Assignee: Eastern Air Devices, Inc., Great Neck, N.Y.
[22] Filed: Aug. 12, 1974
[21] Appl. No.: 496,647

[52] U.S. Cl.............. 321/8 R; 321/46; 330/30 D; 328/26
[51] Int. Cl.².......................................... H02M 7/00
[58] Field of Search ...... 321/8 R, 46, 47; 330/30 D; 324/119; 328/26

[56] References Cited
UNITED STATES PATENTS

| | | |
|---|---|---|
| 3,419,787 | 12/1968 | Baehre.................................. 321/47 |
| 3,626,214 | 12/1971 | Wesner.............................. 330/30 D |
| 3,787,755 | 1/1974 | Goldner.............................. 321/8 R |

*Primary Examiner*—Gerald Goldberg
*Attorney, Agent, or Firm*—Holland, Armstrong, Wilkie & Previto

[57] ABSTRACT

An improved half-wave rectifying circuit is described employing a high-gain differential amplifier including a negative feedback means for stabilizing the amplifier gain and including means for supplying an offset current and an operating bias at the amplifier input with the feedback, offset and biasing means including a number of resistors which are proportioned to provide a substantially zero output in the absence of an input signal and to provide an output which is a half-wave rectified output replica of an oscillating input.

6 Claims, 4 Drawing Figures

HALF-WAVE RECTIFIER CIRCUIT

BACKGROUND OF THE INVENTION

The present invention relates to improvements of half-wave rectifying circuits for use in electric instrumentation, synchronous detection circuits, and similar applications.

Previously, half-wave rectification of alternating voltage signals has been accomplished, for example, by a diode or other rectifying or differential conducting means connected between a source of alternating voltage signals and a load, the common terminals of source and load being connected together. Depending on the polarity of the diode connection, the output voltage was positive or negative and the error in output voltage was the voltage drop of the rectifying means itself.

Numerous attempts have been made to reduce or eliminate the error of the rectifying means. For example, mechanical switches operated by a source of alternating current and synchronized to the source of alternating voltage signals have been used with some success, although limitations of contact life and restricted speed of response to the synchronizing signals have restricted applications to power circuits as opposed to measurement applications.

In signal detecting applications, field-effect transistors have been used such as described in my U.S. Pat. No. 3,662,113 entitled STEREOPHONIC DEMODULATOR APPARATUS AND AUTOMATIC MONOPHONIC-STEREOPHONIC SWITCHING CIRCUIT and dated May 9, 1972. Here, the signal voltage has to be kept small with respect to the pinch-off voltage of the field-effect transistor and the load resistance has to be kept large with respect to the channel resistance of the field-effect transistor in its "on" state. Consequently, maximum output current is limited to values typically not exceeding a few tens of microamperes, and the switching or synchronizing signal may require neutralization of undesirable capacitive coupling to the signal circuit.

In other signal detecting applications use has been made of a high-gain amplifier having an "inverting" input where the input signal is coupled to the amplifier input via a series resistor and the rectified output is obtained via a diode connected to the output of the amplifier. A feedback resistor connected between the rectified output terminal and the amplifier output determines the gain of this circuit, while a second diode connected between amplifier output and amplifier input, opposite in polarity to the first diode, prevents amplifier overload for signals of "reverse" polarity.

Such a circuit requires typically two well regulated power supply voltages of opposite polarity for operation of the inverting amplifier, adding considerably to the complexity of this circuit.

In the present invention it has been discovered that a half-wave rectifier circuit can be constructed employing a high-gain differential amplifier operated from a single power supply without need of voltage regulation and thereby obviating the two well regulated power supplies required in prior art. Furthermore, the two diodes required in prior art are no longer required, thereby eliminating a source of dependence of such rectifier circuits on temperature.

Accordingly, an object of the present invention is to provide an improved half-wave rectifying circuit.

Another object of the present invention is to provide a half-wave rectifying circuit with minimal error.

Another object of the present invention is to provide an improved half-wave rectifier employing a high-gain differential amplifier using only a single power supply without need for voltage regulation.

Another object of the present invention is to provide an improved half-wave rectifier which is independent of temperature.

Other and further objects of the invention will be obvious upon an understanding of the illustrative embodiment about to be described or will be indicated in the appended claims, and various advantages not referred to herein will occur to one skilled in the art upon employment of the invention in practice.

BRIEF DESCRIPTION OF THE DRAWING

A preferred embodiment of the invention has been chosen for purposes of illustration and description and is shown in the accompanying drawing, forming a part of the specification, wherein:

FIG. 1 is a schematic diagram illustrating a preferred embodiment of the circuit in accordance with the invention.

FIG. 4 is a schematic diagram illustrating the circuit of FIG. 1 adapted to synchronous signal detection.

DESCRIPTION OF THE PREFERRED EMBODIMENTS

Figure 2:
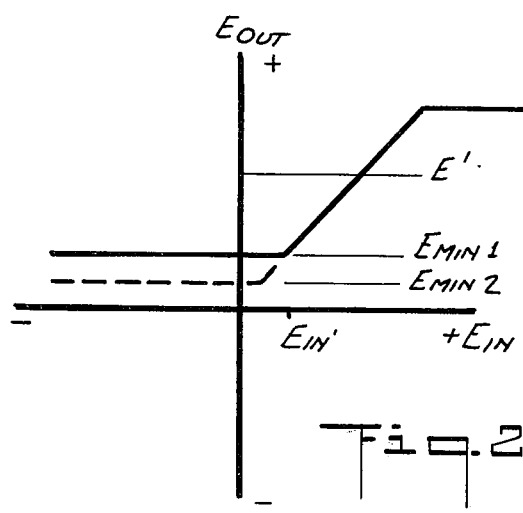
FIG. 2 is a graph illustrating the output voltage of the circuit of the invention as a function of the input signal.

Referring to FIG. 1, a differential amplifier A, having a + or non-inverting input terminal 1, a − or inverting input terminal 3, an output terminal 5, a positive supply terminal 7, and a negative supply terminal 9 is illustrated connected to circuit output terminals 11 and 11' for connection to a further utilization means, such as a peak threshold detector, not shown, with output terminal 11' connected to a common or ground terminal G. Amplifier supply current is supplied from a positive voltage source B+ to terminal 7 and returned to ground G via terminal 9.

An input signal applied to input terminals 13 and 13' is fed to the primary winding 15 of input transformer T and the secondary winding 17 feeds the signal via a resistor R1 to the differential input terminals 1 and 3 of the amplifier A. A negative feedback current, to stabilize the gain of amplifier A, is fed via resistor R5 from output terminal 5 to the inverting input terminal 3. An offset current, to permit the amplifier A to function as a rectifier, is supplied from the supply voltage B+ via resistor R4 to the inverting input terminal 3 of the amplifier A. Operating bias for the non-inverting input terminal 1 of amplifier A is supplied via a voltage divider resistor R2, connected between source of operating voltage B+ and terminal 1, and resistor R3 connected between terminal 1 and ground G.

It will now be shown that a critical proportioning of resistors R1, R2, R3, R4, and R5 provides a half-wave rectified replica of an input signal connected to terminals 13 and 13' at output terminals 11 and 11' and that a further critical proportioning of these resistors minimizes the influence of imperfections in the characteristics of amplifier A on the aforementioned replica. A still further critical proportioning of these resistors permits the circuit to act as an amplifying half-wave rectifier or as a rectifier responding to the signal current supplied to input terminals 13 and 13'.

For illustration of the operation of the circuit of FIG. 1, it is assumed that the amplifier A is a perfect differential amplifier requiring an insignificantly small input signal applied between the inverting input 3 and the non-inverting input 1 to appear as an output voltage on terminal 5.

To achieve a half-wave rectified output signal at terminals 11 and 11' it is necessary for the amplifier A to produce an output signal of zero value with respect to the common or ground terminal G when zero input signal is applied. In the present invention, with a single positive supply voltage B+ and a common node G, a zero output voltage is obtained when the ratio of the resistor bias divider for the noninverting input, composed of resistors R2 and R3 is equal to the ratio of the resistors feeding bias and feedback signal to the inverting input, composed of resistors R4 and R5. This first critical ratio may be considered as being determined by an analogy to a Wheatstone resistance bridge. The bridge unbalance voltage, analogous to the amplifier input voltage, is zero when the ratio of resistor R2 to resistor R3 equals the ratio of resistor R4 to resistor R5 and the output voltage at 5 is at ground G potential. Consequently, the onset of rectification is independent of supply voltage B+.

The input signal to the circuit is applied via the transformer T for the purpose of preventing direct current or potential which may be present at terminals 13 and 13' from upsetting the circuit bias conditions established above. Since only alternating voltage or current signals are generally of concern, the limitation on responce with respect to frequency imposed by a transformer can be minimized by appropriate transformer construction. If the transformer T has a turns ratio equal to N between its secondary and primary windings 17 and 15, the voltage amplification factor KV of this circuit for positive pulses applied to terminal 13 becomes $$KV = N \times \frac{R5}{R1} \left[ 1 + \frac{R2 \times r3 (R4 + R5)}{(R2 + R3) R4 \times R5} \right]$$

which reduces to
$KV = N \times (R3 + R5)/R1$
when
$(R2/R3) = (R4/R5)$
as determined above. Any transformer winding resistances can be considered to be part of resistor R1.

Since the amplifier output voltage is limited to values between supply voltage B+ and Ground G, the amplification factor of the amplifier is zero for negative pulses applied to terminal 13. Consequently, the output voltage at terminals 11 and 11' consists of the amplified positive portion of the signal applied to terminals 13 and 13' and half-wave rectification has thus taken place.

Since no voltage drop exists between input terminals 1 and 3 of the perfect amplifier, the input impedance of the circuit as seen from the secondary winding 17 of transformer T is equal to $R1$, which becomes $(R1/N^2)$ at terminals 13 and 13'. Consequently, the input current to output voltage amplification factor or transfer impedance ZT becomes
$ZT = (R3 + R5)/N$
when
$(R2/R3) = (R4/R5)$
for positive input current pulses, and zero for negative current pulses. Again, amplified half-wave rectification of the input signal has taken place.

Practical amplifiers of the differential input type have various imperfections, such as differential input offset current, differential offset voltage, input bias current, and input bias voltage, all of which are required by each individual amplifier to keep the output voltage within the normal operating range, here between the limits of B+ and ground. These voltages and currents have to be supplied via resistors R1, R2, R3, R4, and R5 and the secondary winding 17 of transformer T.

An object of the present invention, therefore, is not only the construction of an improved half-wave rectifier circuit, but also the choice of relative component values to minimize the influence of imperfections.

Considering the input offset current of the differential input amplifier A, this is the difference between the input current to the inverting input 3 and the non-inverting input 1 of amplifier A required to keep the output signal within the voltage limits of B+ and ground in the absence of feedback. In the present invention, the influence of this current, when
$(R2/R3) = (R4/R5)$
ratios are maintained is exactly equal to the influence of a signal input current flowing in the secondary winding 17 of transformer T. Consequently, it is required that such amplifiers have a differential input current equal to or less than the maximum tolerable signal current error.

Considering the input bias current required by both the inverting input 3 and the non-inverting input 1 of amplifier A, this is the current required equally by both inputs and in the same direction. In the present invention, the output offset voltage will be
$, Eo = I_B(R3 - R5)$
when
$(R2/R3) = (R4/R5)$
where $I_B$ is the bias current and $Eo$ is the output offset voltage.

The new unexpected result of this half-wave rectifier circuit was that the output error due to input bias current was independent of the value of amplification as determined by the value of resistor R1 or the turns ratio N of transformer T. A further unexpected result was that the influence of bias current could be made zero by setting resistor R2 equal to resistor R4 and resistor R3 equal to resistor R5, which is the further critical proportioning of the circuit resistors.

Considering the input offset voltage as required as a difference in input voltage to the inverting input 3 and non-inverting input 1 of amplifier A, to maintain the amplifier output voltage within the limits of B+ and Ground G. This voltage requires an error current to flow not only through resistor R1 and the secondary winding 17 of transformer T, but also additional error currents to flow through all the other resistors R2, R3, R4, and R5. The influence of the additional error currents is made zero when the several critical proportions of R2, R3, R4, and R5 are maintained as shown above. The remaining output error voltage will then be equal to the input offset voltage multiplied by $(1 + (R4/R5))$.

The preceding circuit description and analysis of the present invention was made under the supposition that the output signal at terminal 5 of amplifier A can be between the limits of B+ and ground G. Many amplifiers are capable of operating in this manner, however, certain amplifiers of monolithic integrated semiconductor construction are not capable of operation below a certain minimum output voltage or above a certain other maximum output voltage, as determined for example, by the supply voltage B+.

In FIG. 2 the input to output transfer curve is shown, diagrammatically presented as a plot of output voltage Eout with respect to input voltage Ein.

For negative input voltages Ein, Eout may remain at a fixed value. As the input voltage exceeds value Ein, the amplifier output voltage will rise following a slope of amplification equal to KV, the extension of this line passing through the intersection of zero output voltage Eout and zero input voltage Ein. At some input level, the maximum output voltage capability Emax of the amplifier is reached and the output of the amplifier remains at level Emax with further increase in input level.

An amplifier of different design may have a different threshold voltage Emin2, and perhaps a different maximum output voltage Emax. For accurate half-wave rectification it is of course desirable to have a minimum output voltage Emin as close to zero as practical. However, in many applications of this rectifier circuit it is required only to produce a repeatable voltage E' at terminals 11 and 11' with a known input signal such as may be required by a voltage sensitive threshold detector. In such a case, a change from an amplifier of one design or construction to an amplifier of different design or construction will not influence the achievement of the same repeatable voltage output.

A further object of the invention therefore is the design of a circuit capable of producing unipolar amplified output signals of predetermined value due to known input signals having independence from amplifier errors or amplifier threshold voltages.

Figure 3:
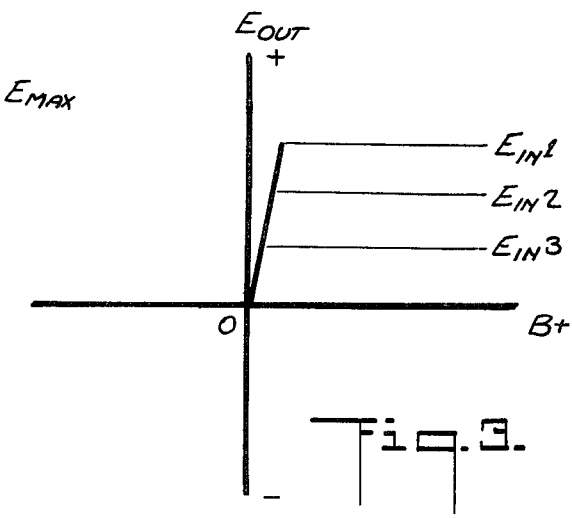
FIG. 3 is a graph illustrating the output voltage of the circuit of the invention as a function of the supply voltage and input signal.

In FIG. 3, a diagrammatic plot is made of the output voltage of terminals 11 and 11' of the circuit of FIG. 1 as the supply voltage B+ is varied while maintaining input signal voltages to terminals 13 and 13' at fixed values Ein 1, Ein 2, and Ein 3. Here it can be seen that the output signal of amplifier A remains constant as soon as the supply voltage B+ exceeds the requirement of output voltage (plus some upper supply voltage threshold voltage). This permits the circuit of the present invention to be operated from power supply voltages having poor regulation or having large noise and other errant signals without influencing the resultant output.

Furthermore, if all the supply terminals B+ of the circuit of FIG. 1 were supplied from a half-wave rectified carrier voltage, the output signal available at the output terminals 11 and 11' would then be sensitive not only to the amplitude of the input signal connected to terminals 13 and 13', but also the relative phase of this signal with respect to the carrier.

One preferred embodiment of such phase sensitive half-wave rectifying circuit is shown in FIG. 4 where a source of carrier oscillations is applied to terminals 19 and 19'. A portion of these oscillations is rectified with diode D1 to produce supply voltage B+ via series current limiting resistor R6. An optional avalanche diode D2 is used to prevent carrier voltages which exceed the maximum safe operating voltages of amplifier A from reaching its supply terminals 7 and 9. A signal modifying circuit 21 is interposed between the source of carrier signal 19 and 19' and the input of the half-wave rectifying circuit as shown by primary winding 15 of transformer T. Output signal for a further utilization means is available on terminals 11 and 11'. The output signal at terminals 11 and 11' is thus responsive not only to the amplitude signals created by the signal modifying circuit but also the phase relative to the phase of the carrier signal.

Illustrations of possible signal modifying circuits are telephone, telegraph, radio, or television waves dependent upon a carrier signal. Other modifying circuits may be the control signals or other signals of analog or digital nature. There is no limit on the frequency of carrier oscillations, the limitations of the circuit of the present invention being the limitations of the transformers or other coupling circuits or the response of amplifiers to rapidly varying signals.

Although described for amplifiers connected to positive supply voltages, connection to negative supply voltages will permit the circuit of the present invention to produce output signals of negative polarity. Similarly, other amplifying relays of other than semiconductor, tube or other construction such as magnetic, electrostatic, hydraulic or pneumatic are adaptable to this type of circuit.

As various changes may be made in the form, construction and arrangement of the parts herein without departing from the spirit and scope of the invention and without sacrificing any of its advantages, it is to be understood that all matter herein is to be interpreted as illustrative and not in a limiting sense.

Having thus described my invention, I claim:

1. An improved half-wave rectifying circuit comprising the combination of:

a differential amplifier having inverting input, noninverting input, output, supply voltage, and ground terminals;

a voltage source;

a negative feedback comprising a resistor R5 coupled between said output and inverting terminals;

means to supply an offset current to said inverting input terminal comprising a resistor R4 coupling said voltage source to said inverting input terminal;

means for supplying an operating bias to said noninverting input terminal comprising serially connected resistors R2 and R3 coupling said voltage source to the ground with the noninverting input terminal connected to the junction of the resistors R2 and R3; and said resistors R2, R3, R4 and R5 being proportioned to provide a substantially zero output compared to the ground terminal in the absence of an input signal.

2. The rectifying circuit as claimed in claim 1 where the value of said resistors has the relation
   $(R2/R3) = (R4/R5)$.

3. The rectifying circuit as claimed in claim 2 in which said resistors R2, R3, R4 and R5 are of equal value.

4. The rectifying circuit as claimed in claim 1 which further comprises a transformer having its secondary coupled to said inverting and noninverting inputs and having its primary adapted for connection to an oscillating signal.

5. The rectifying circuit as claimed in claim 4 which further comprises a resistor coupled in series with the transformer secondary.

6. The rectifying circuit as claimed in claim 1 in which said resistors are also proportioned to provide an output which is a half-wave rectified replica of an oscillating input signal coupled to said inverting and noninverting inputs.

* * * * *